(12) United States Patent
Oshio

(10) Patent No.: US 8,342,021 B2
(45) Date of Patent: Jan. 1, 2013

(54) COMPOSITE SENSOR AND ELECTRONIC DEVICE

(75) Inventor: Masahiro Oshio, Shiojiri (JP)

(73) Assignee: Seiko Epson Corporation (JP)

( * ) Notice: Subject to any disclaimer, the term of this patent is extended or adjusted under 35 U.S.C. 154(b) by 368 days.

(21) Appl. No.: 12/705,764

(22) Filed: Feb. 15, 2010

(65) Prior Publication Data

US 2010/0206075 A1 Aug. 19, 2010

(30) Foreign Application Priority Data

Feb. 17, 2009 (JP) .................................. 2009-033604
Feb. 5, 2010 (JP) .................................. 2010-024062

(51) Int. Cl.
*G01P 1/02* (2006.01)

(52) U.S. Cl. ......................................................... 73/493

(58) Field of Classification Search .................... 73/493, 73/510, 511, 514.32, 504.12, 504.14, 504.04
See application file for complete search history.

(56) References Cited

U.S. PATENT DOCUMENTS

| 6,159,761 A * | 12/2000 | Okada ............................. 438/53 |
| 7,004,025 B2 | 2/2006 | Tamura |
| 7,243,561 B2 * | 7/2007 | Ishigami et al. ............. 73/866.1 |
| 8,047,075 B2 * | 11/2011 | Nasiri et al. ................ 73/514.32 |
| 2008/0136000 A1 * | 6/2008 | Fischer et al. ................ 257/682 |
| 2009/0183568 A1 * | 7/2009 | Yamanaka et al. ......... 73/504.04 |
| 2011/0016972 A1 * | 1/2011 | Reinert ...................... 73/504.12 |
| 2011/0048129 A1 * | 3/2011 | Yamanaka et al. ......... 73/504.12 |

FOREIGN PATENT DOCUMENTS

| JP | 10-010148 | 1/1998 |
| JP | 2002-005950 | 1/2002 |

* cited by examiner

*Primary Examiner* — Helen C. Kwok
(74) *Attorney, Agent, or Firm* — Harness, Dickey & Pierce, P.L.C.

(57) ABSTRACT

A composite sensor includes: a package including a container and a lid; a plurality of spaces that is partitioned by at least the container and the lid, and has different pressures, the plurality of the spaces including a first space sealed at around an atmospheric pressure and a second space sealed at a depressurized state; an acceleration sensor element disposed in the first space; and a vibration type angular velocity sensor element disposed in the second space. In the sensor, the first space has a volume smaller than a volume of the second space.

10 Claims, 5 Drawing Sheets

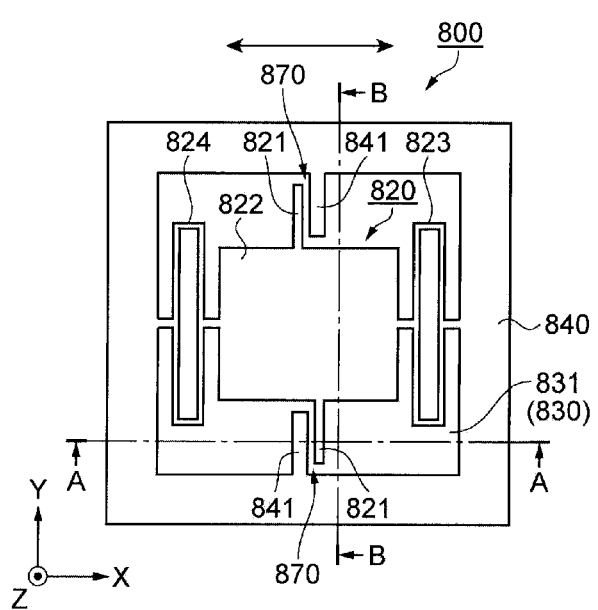
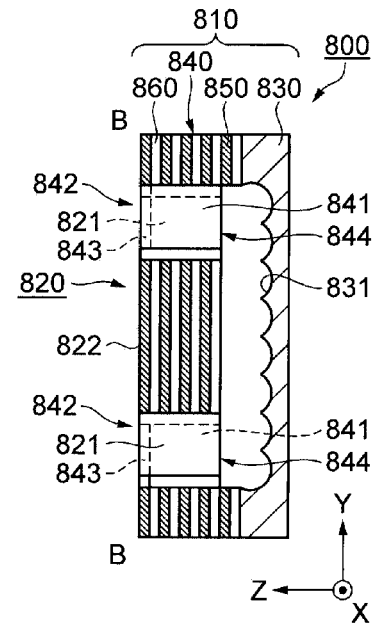
FIG. 4A  FIG. 4C
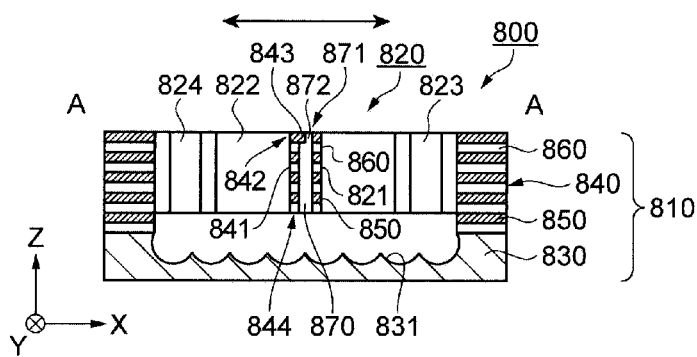
FIG. 4B

COMPOSITE SENSOR AND ELECTRONIC DEVICE

BACKGROUND

1. Technical Field

The present invention relates to a composite sensor and electronic device housing sensor elements, such as an acceleration sensor element and a vibration type angular velocity sensor, in the same package.

2. Related Art

Sensor elements used for composite sensors differ in sizes or optimum use environment depending on the kinds thereof. For example, a low Q value is required for an acceleration sensor element detecting a movement of a movable section from a point view of a transient response or a shock resistance. In contrast, a higher Q value is required for a vibration type angular velocity sensor element as compared to the acceleration sensor element. Both sensor elements include movable sections. The Q value is designed by utilizing viscosity of a gas surrounding the sensor element. The pressure surrounding the sensor element, thus, needs to be changed for attaining the designed Q.

Specifically, the acceleration sensor element needs to be sealed at around the atmospheric pressure because a dumping effect by the gas is utilized while the vibration type angular velocity sensor element needs to be sealed at a depressurized state in order no to be affected by the gas.

In addition, the size of the acceleration sensor element is generally smaller than that of the vibration type angular velocity sensor element because of its structure.

Composite sensors are known that include an acceleration sensor element and an angular velocity sensor element in the same package. Refer to JP-A-2002-5950 (page 4 and FIG. 1), for example.

Another composite sensor is also known in which an acceleration sensor chip (element) and an angular velocity sensor chip (element) are disposed on the same substrate. Refer to JP-A-10-10148 (page 3, and FIG. 1), for example.

The composite sensor including the acceleration sensor element and the angular velocity sensor element in the same package has a structure withstanding external shocks. However, the pressure of the gas surrounding each sensor element is not adjusted to the optimum value. Accordingly, if the whole package is sealed at the atmospheric pressure, the Q value of the angular velocity sensor element is lowered, deteriorating the characteristics. On the other hand, if the whole package is sealed at a depressurized state, the Q value of the acceleration sensor element is increased, deteriorating the transient response characteristic. The composite sensor in which the acceleration sensor element and the angular velocity sensor element are disposed on the same substrate can be provided with a small size and low costs. However, the pressure of the gas surrounding each sensor element is also not adjusted to the optimum value.

Further, a plurality of spaces having different pressures provided in one package causes a leak between spaces having different pressures. It is thus difficult to control the fluctuation of the characteristics in a long period of time.

SUMMARY

An advantage of the invention is to provide a downsized composite sensor that allows sensor elements included therein to well exhibit the characteristics and fluctuation of the characteristics in a long period time to be controlled.

A composite sensor of the invention includes: a package including a container and a lid; a plurality of spaces that is partitioned by at least the container and the lid, and has different pressures, the plurality of the spaces including a first space sealed at around an atmospheric pressure and a second space sealed at a depressurized state; an acceleration sensor element disposed in the first space; and a vibration type angular velocity sensor element disposed in the second space. In the sensor, the first space has a volume smaller than a volume of the second space. A composite sensor, comprising: a package including a first space having a first pressure and a second space having a second pressure lower than a first pressure; an acceleration sensor element disposed in the first space; and a vibration type angular velocity sensor element disposed in the second space, wherein the first space has a volume smaller than a volume of the second space. The package including a container and a lid and a partitioned member, the first space and the second space is partitioned by the partitioned member.

The sensor includes the spaces having different pressures in the package, and different kinds of sensor elements are disposed corresponding to the pressures in the respective spaces. As a result, each sensor element well exhibits the characteristics.

The spaces having different pressures are partitioned by at least the container and the lid that are included in the package. This structure does not need to make a space having a different pressure in the package by putting another package therein. As a result, the composite sensor can be provided with a small package and low costs without needs for an additional lot of members.

Further, the acceleration sensor element can attain a low Q value since it is disposed in the space having a high pressure while the vibration type angular velocity sensor element can attain a high Q value since it is disposed in the space having a low pressure. As a result, the acceleration sensor element and the vibration type angular velocity sensor element well exhibit the characteristics.

The pressure inside the space having a low pressure is less affected by a leakage since the space has a large volume. This structure enables a long-term fluctuation of the characteristics of the vibration type angular velocity sensor element to be lessened.

The acceleration sensor element that is smaller than the vibration type angular velocity sensor element is disposed in the space having a high pressure and a small volume. This structure enables the composite sensor to be provided with a smaller size.

In the sensor, at least one of a wall forming the first space and a wall forming the second space may have a through hole. And the through hole is sealed by a sealing member.

In a case where the through hole is provided to the wall forming the space to have a low pressure, the space is depressurized through the through hole by subjecting the whole package to a depressurized state after forming of the package. As a result, the space having a high pressure and the space having a low pressure can be simultaneously achieved.

In a case where the through hole is to be provided to the wall forming the space having a high pressure, the container and the lid are bonded while being depressurized, and the through hole is provided to the wall forming the space to have a high pressure, and then gas is introduced from the through hole to set the pressure difference between the spaces.

In the sensor, a height of a bottom surface forming the first space and a height of a bottom surface forming the second space may be different from each other.

In the sensor, the positions of the bottom surfaces of the spaces in which different kinds of sensor elements are disposed are different from each other. As a result, the interaction between the sensor elements due to vibrations of them can be lowered. The degree of positional freedom of the space having a high pressure and the space having a low pressure is increased. As a result, the container and the lid can be easily bonded.

In the sensor, at least one of the container and the lid may have a layered structure.

According to the sensor, the shapes of the container and the lid for partitioning and forming the spaces having different pressures can be easily achieved by the layering without the forming. In addition, the aforementioned effects can be achieved in the layered structure in which the leak likely occurs.

Further, an electronic device comprises the composite sensor. It is possible to control the fluctuation of the characteristics in a long period of time.

BRIEF DESCRIPTION OF THE DRAWINGS

The invention will be described with reference to the accompanying drawings, wherein like numbers reference like elements.

FIG. 4A is a schematic plan view of an acceleration sensor.

FIG. 4B is a schematic sectional view taken along the line A-A of FIG. 4A.

FIG. 4C is a schematic sectional view taken along the line B-B of FIG. 4A.

DESCRIPTION OF EXEMPLARY EMBODIMENTS

Embodiments are described in detail below with reference to the accompanying drawings.

First Embodiment

Figure 1A:
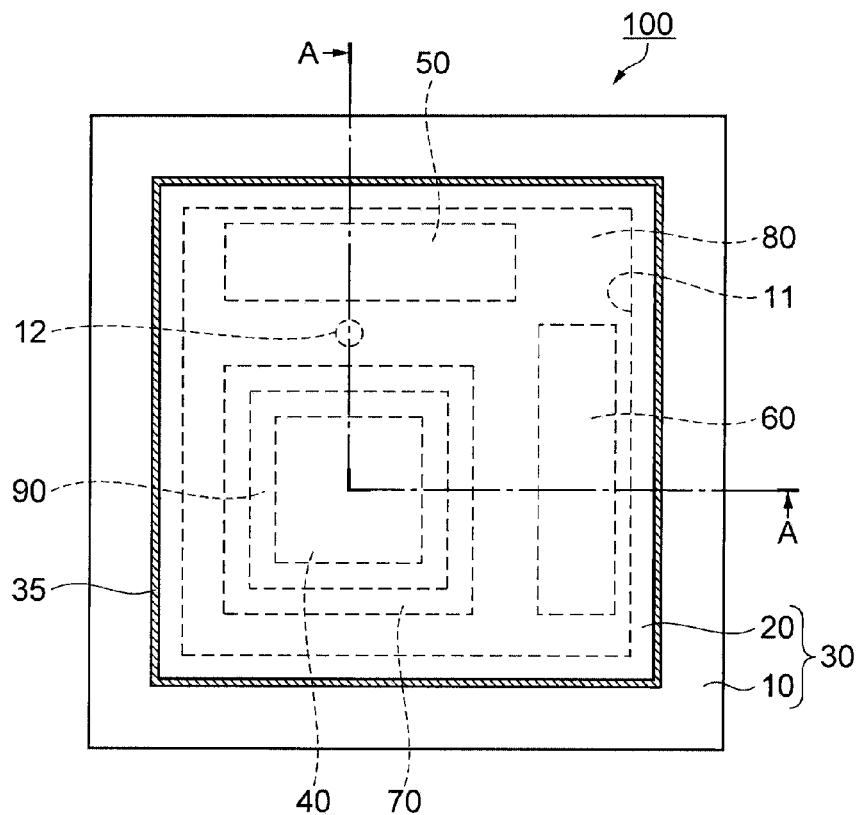
FIG. 1A is a schematic plan view of a composite sensor according to a first embodiment of the invention.
Figure 1B:
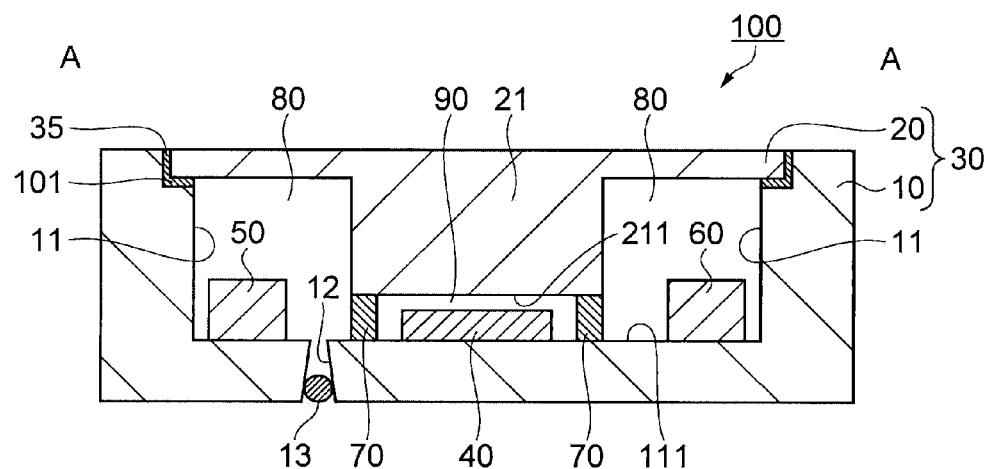
FIG. 1B is a schematic sectional view taken along the line A-A of FIG. 1A.

FIGS. 1A and 1B are schematic views showing a composite sensor 100 according to a first embodiment of the invention. FIG. 1A is a schematic plan view. FIG. 1B is a schematic sectional view taken along the line A-A of FIG. 1A.

As shown in FIGS. 1A and 1B, the composite sensor 100 includes a package 30 that is composed of a container 10 and a lid 20 and is roughly block-shaped. The package 30 houses an acceleration sensor element 40 and vibration type angular velocity sensor elements 50 and 60.

The container 10 has a recessed section 11. A step 101 is formed around the periphery of an opening of the recessed section 11. On the other hand, the lid 20 has a protruded section 21. The lid 20 is assembled to the step 101 of the container 10 in a manner such that the protruded section 21 is inside the recessed section 11 of the container 10, and is bonded with a bonding member 35.

A sealing member (a partitioned member) 70 having a frame shape is disposed between an upper surface 211 of the protruded section 21 and a bottom surface 111 of the recessed section 11. As a result, a space (a second space) 80 having a large volume and a space (a first space) 90 having a small volume are formed, both which are partitioned by the container 10, the lid 20, and the sealing member 70.

In FIG. 1A, the space 90 is disposed off from the center of the space 80. The space 90, however, may be disposed at the center of the space 80. The acceleration sensor element 40 is disposed inside the space 90. The acceleration sensor element 40 may be any one type of single-axis, two-axis, and three-axis ones.

The vibration type angular velocity sensor elements 50 and 60 are disposed inside the space 80. The vibration type angular velocity sensor elements 50 and 60 are disposed so as to be orthogonal to each other. This arrangement enables angular velocities in two directions to be measured.

The container 10 and the lid 20 can be made of an insulation material such as glass and ceramic, or metal. They can also be made of resin. As the resin, a liquid crystal polymer having a low moisture permeation rate is recommendable.

It is favorable that the lid 20 and the container 10 are made of the same material, so that the lid 20 and the container 10 are prevented, for example, from being peeled off from each other due to stresses caused by the difference in the thermal expansion rates.

As the bonding member 35 bonding the container 10 and the lid 20, mention may be made of solder, low melting point glass, and adhesives.

The bottom surface 111, which serves as a wall of the space 80 in the container 10, has a through hole 12. The space 80 is depressurized through the through hole 12, and then the through hole 12 is sealed with a sealing member 13. As a result, the space 80 turns to the space (a second space) 80 that is depressurized to a pressure lower than the atmospheric pressure and sealed. In contrast, the space 90 turns to the space (a first space) 90 that is sealed at a pressure around the atmospheric pressure without being depressurized. The first space 90 has a pressure of an atmosphere at a time when the container 10 and the lid 20 are bonded. Because of this mechanism, in a case where the first space 90 needs to be pressurized to a higher pressure, the container 10 and the lid 20 are bonded under a pressure higher than the normal pressure.

Hereinafter, the space 80 having a large volume and the second space 80 having a low pressure present the same space while the space 90 having a small volume and the first space 90 having a high pressure also present the same space.

The first embodiment produces the following effects.

(1) The first space 90 and the second space 80 are formed in the package 30. The acceleration sensor element 40 disposed in the first space 90 having a high pressure shows a low Q value while the vibration type angular velocity sensor elements 50 and 60 disposed in the second space 80 having a low pressure show high Q values. As a result, the acceleration sensor element 40 and the vibration type angular sensor elements 50 and 60 can well exhibit the characteristics.

(2) The first space 90 and the second space 80 are partitioned by at least the container 10 and the lid 20 that are included in the package 30. This structure does not need to make a space having a different pressure in the package 30 by putting another package therein. As a result, the composite sensor 100 can be provided with a small package and low costs without needs for an additional lot of members.

(3) The pressure inside the second space 80 is less affected by a leakage since it has a large volume. This structure enables a long-term fluctuation of the characteristics of the vibration type angular velocity sensor elements 50 and 60 to be lessened.

The characteristic fluctuation due to a leak is described in more detail below.

Figure 2:
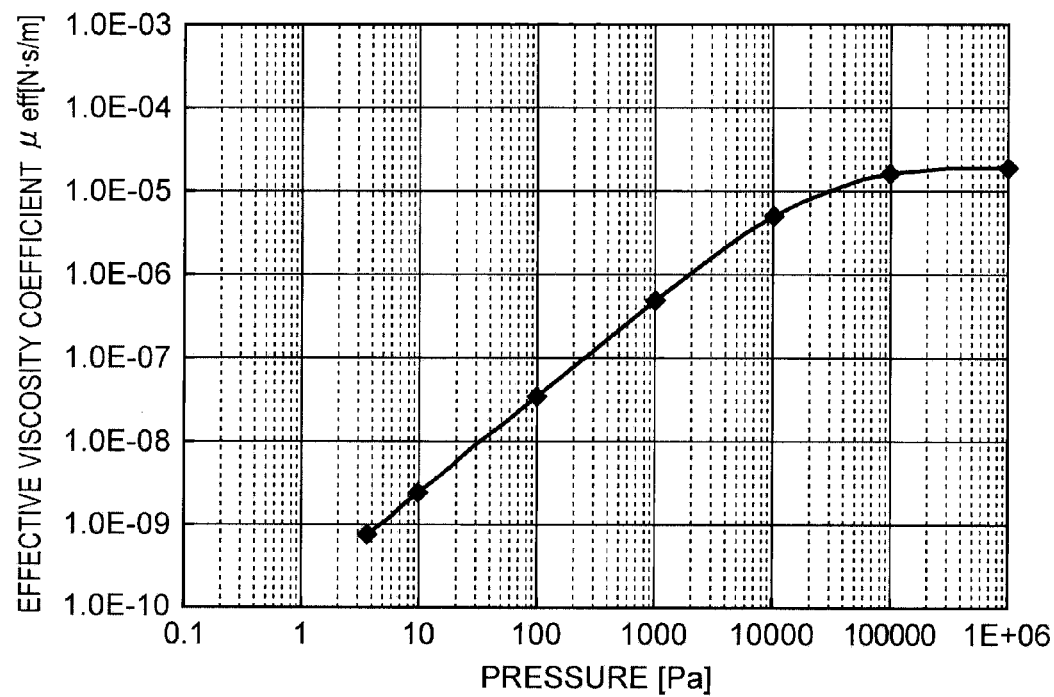
FIG. 2 is a view showing a relation between a pressure and an effective viscosity coefficient of air.

FIG. 2 shows a relation between a pressure and an effective viscosity coefficient of air. The abscissa axis shows a pressure while the ordinate axis shows an effective viscosity coefficient.

As can be seen from FIG. 2, the viscosity coefficient of air is slightly changed when the pressure fluctuates around the atmospheric pressure. The acceleration sensor element 40, thus, slightly changes the characteristics. In other words, the acceleration sensor element 40 is hardly affected by a leak. In contrast, a pressure such as a depressurized atmosphere in which the vibration type angular velocity sensor elements 50 and 60 are housed, e.g., 10 to 100 Pa, the effective viscosity coefficient is significantly changed. In other words, the vibration type angular velocity sensor elements 50 and 60 are easily affected by a leak.

The second space 80, thus, is significantly affected by a leak.

(4) The acceleration sensor element 40 that is smaller than the vibration type angular velocity sensor elements 50 and 60 is disposed in the first space 90 having a small volume. The composite sensor 100, thus, can be provided with a smaller size.

(5) Since the through hole 12 is provided to the wall forming the second space 80, the second space 80 is depressurized through the through hole 12 while the package 30 is wholly subjected to a depressurized state after the package 30 is formed. As a result, the first space 90 and the second space 80 can be provided simultaneously.

Modification 1

Figure 3:
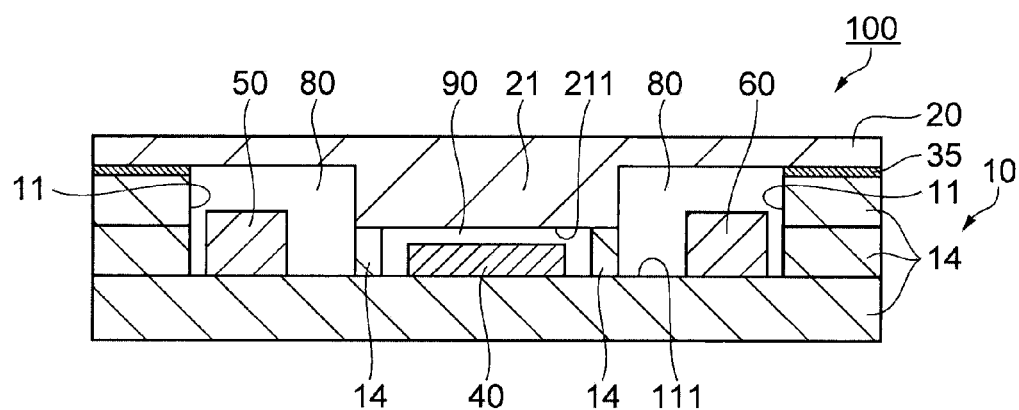
FIG. 3 is a schematic sectional view of a composite sensor of a modification 1.

FIG. 3 is a schematic cross sectional view showing a case in which the container 10 is structured with, for example, layered ceramic plates, which are shown as insulation substrates 14. The through hole 12 and the sealing member 13 are omitted. As shown in FIG. 3, the container 10 has a layered structure composed of the insulation substrates 14. In this case, the sealing member 70 in the first embodiment can be replaced by the insulation substrate 14.

The shape and the structure of the composite sensor 100 shown in FIG. 3 are roughly the same as those of the first embodiment except that the step 101 supporting the lid 20 is not formed to the container 10. In the modification 1, the lid 20 and the insulation substrate 14 are bonded with the bonding member 35.

The container 10 and the lid 20 can be made of a number of substrates of an insulation material, such as glass and ceramic, by layering them.

The modification produces the following effects.

(6) The shapes of the container 10 and the lid 20 for partitioning and forming the first space 90 and the second space 80 can be easily achieved by the layering without the forming. In addition, the aforementioned effects can be achieved in the layered structure in which a leak likely occurs.

As the acceleration sensor element 40, an acceleration sensor element 800 described below can be employed, for example.

FIGS. 4A, 4B, and 4C are schematic views of the acceleration sensor element 800. FIG. 4A is a schematic plan view of the acceleration sensor element 800. FIG. 4B is a schematic sectional view taken along the line A-A of FIG. 4A. FIG. 4C is a schematic sectional view taken along the line B-B of FIG. 4A. The X-axis, Y-axis, and X-axis directions are shown in each figure.

The bidirectional arrow in the figure shows an acceleration detection direction. The X-axis direction is the acceleration detection direction.

In FIGS. 4A to 4C, the acceleration sensor element 800 has a supporting body 810 and a movable section 820.

The supporting body 810 includes a substrate 830 and a supporting section 840 formed on the substrate 830. The movable section 820 is also formed above the substrate 830.

The substrate 830 is a silicon substrate. The substrate 830 has a recessed section 831 on a surface thereof facing the movable section 820 so as to keep a distance from the movable section 820. The recessed section 831 has a depth satisfying that the movable section 820 does not collide against the recessed section 831 by being bent to a side adjacent to the substrate 830 when an impact is applied in the Z-axis direction of the movable section 820.

The movable section 820 and the supporting section 840 are formed by utilizing a layered structure such as a wiring layer 850 and an interlayer insulation film 860, which are included in a complementary metal oxide semiconductor (CMOS) integrated circuit formed in an other area on the substrate 830 as an integrated circuit, for example. The wiring layer 850 can be made of Al, Cu, Al alloys, Mo, Ti, W, or Pt, for example. The wiring layer 850 includes a barrier film made of materials such as TiN, Ti, TiW, TaN, WN, VN, ZrN, and NbN, and an antireflection film made of materials such as TiN, and Ti. Those materials are used for forming the CMOS integrated circuit. The wiring layer 850 also includes a gate electrode of the CMOS. The gate electrode is made of polysilicon containing impurities, silicide, tungsten (W), or the like. For the interlayer insulation film 860, $SiO_2$, tetraethoxysilane (TEOS), borophosphosilicate glass (BPSG), non-doped silicon glass (NSG), spin on glass (SOG), and the like can be used. The layered structure may include a protective film that is made of SiN, $SiO_2$, or the like, and is formed on the uppermost surface of the CMOS integrated circuit.

The wiring layer 850 made of Al and the like can be formed by sputtering, vacuum deposition, chemical vapor deposition (CVD), or the like. The interlayer insulation film 860 made of $SiO_2$ and the like can be formed by CVD, thermal oxidizing, spin coating, firing or the like.

Here, the movable section 820 and the supporting section 840 may be formed as a different layered structure from the layered structure of the CMOS integrated circuit.

The movable section 820 and the supporting section 840 also may be formed with single-crystalline silicon without being formed as the layered structure.

The supporting section 840 is formed on the substrate 830 as a frame having a rough rectangular shape. The supporting section 840 includes fixed electrodes 841. The fixed electrodes 841 are formed at near centers of two inner faces facing to each other of the supporting section 840 so as to be faced toward the inside of the frame. The fixed electrode 841 has a plate-like block shape.

The movable section 820 includes movable electrodes 821, a weight section 822, and spring sections 823 and 824. The weight section 822 is formed as a rough block shape. The movable section 820 is held at near the center of an area surrounded by the supporting section 840, which is the frame having a rough rectangular shape, at two positions with the spring sections 823 and 824. The spring sections 823 and 824 are interposed between the movable section 820 and remaining two inner faces, to which the fixed electrodes 841 are not formed, of the supporting section 840.

Each of the spring sections 823 and 824 has a structure in which two plate springs are faced and bonded together at the both ends. One of the two plate springs is coupled to the supporting section 840 while the other one is coupled to the weight section 822.

The movable electrode 821 is formed to the weight section 822 at a position facing the fixed electrode 841. The movable electrode 821 also has a plate-like block shape similar to the shape of the fixed electrode 841.

The movable electrode 821 and the fixed electrode 841 face in a manner such that the large surfaces of the respective block shape bodies face each other with a gap 870 therebetween to produce capacitance between the electrodes.

The movable electrode 821 and the fixed electrode 841 are provided as a pair at two positions facing to each other across the weight section 822. The two pairs of the movable electrode 821 and the fixed electrode 841 form a differential detection type in which when the gap at one side is widened that at the other side is narrowed.

A narrowed section 872 is provided at an edge 871 of the gap 870. The narrowed section 872 is provided by forming a protruded section 843 toward the movable electrode 821 at an edge 842, which is at a side remote from the substrate 830, of the fixed electrode 841.

In FIG. 4B, the protruded section 843 is formed by utilizing the wiring layer 850. The protruded section 843, however, may be formed by utilizing the interlayer insulation film 860 in a case where the interlayer insulation film 860 is located at the edge 842.

In FIG. 4C, the protruded section 843 is provided to the edge 842, which extends in the Y-axis direction, of the fixed electrode 841. Thus, the cross-section shape of the fixed electrode 841 shows a letter L shape as shown in FIG. 4B.

The narrowed section 872 may be provided at an edge 844, at a side adjacent to the substrate 830, of the fixed electrode 841. The narrowed section 872 may also be provided to the edges 842 and 844. In this case, the cross-section shape of the fixed electrode 841 shows a recessed groove shape. The protruded section 843 may be provided to the movable electrode 821 to form the narrowed section 872, or may be provided between the edges 842 and 844.

In a case where the acceleration sensor element 800 is formed on the substrate 830 together with a CMOS integrated circuit, the components of the acceleration sensor element 800 are not limited to particular sizes. The dimensions are exemplified as follows.

The thicknesses of the movable section 820 and the supporting section 840 are approximately several micrometers. The supporting section 840 is a frame of approximately several micrometers square. The thickness of each layer of the layered structure is approximately 1 µm. The width of the gap 870, which is a distance of electrodes between the movable electrode 821 and the fixed electrode 841, is approximately several micrometers. The mass of the weight section 822 is approximately in the order of 10-6 grams.

In the acceleration sensor element 800 when it is used, the flow of a gas existing in the gap 870 between the fixed electrode 841 and the movable electrode 821 is inhibited by the narrowed section 872 provided at the edge 871 of the gap 870, when acceleration in the X-axis direction is applied to change the distance between the fixed electrode 841 and the movable electrode 821. As a result, a new flow is produced in the Y-axis direction different from a direction in which the narrowed section 872 is provided. Squeeze film dumping due to the gas flow enables a large dumping constant c to be achieved even though the pressure of the first space 90 is lowered. Accordingly, the pressure difference between the second space 80 and the first space 90 can be reduced. This reduction enables the sealing member 70 and the insulation substrate 14, which serve as the partition wall between the second space 80 and the first space 90, to be formed thinner. As a result, the composite sensor 100 can be provided with a compact size and low costs.

Any acceleration sensor elements having a structure in which the squeeze film dumping is utilized, not only the acceleration sensor element 800, can achieve the same effect.

Second Embodiment

Figure 5:
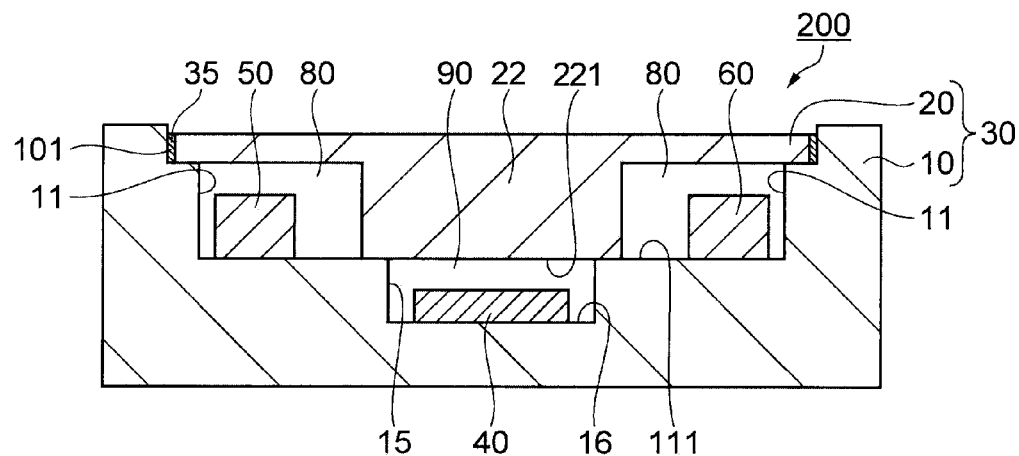
FIG. 5 is a schematic sectional view of a composite sensor of a second embodiment of the invention.

FIG. 5 shows a schematic cross sectional view of a composite sensor 200 according to a second embodiment of the invention. The same numeral is given to the same component of the first embodiment. The differences from the first embodiment are mainly described below. The through hole 12 and the sealing member 13 are omitted.

The structure of the composite sensor 200 shown in FIG. 5 differs from the composite sensor 100 of the first embodiment in that a recessed section 15 is further provided to the bottom surface 111 of the recessed section 11 of the container 10 instead of providing the sealing member 70.

The lid 20 has a protruded section 22 formed higher than the protruded section 21 of the first embodiment. When the container 10 and the lid 20 are assembled to be bonded together, an upper surface 221 of the protruded section 22 makes contact with the bottom surface 111 of the recessed section 11 to cover the recessed section 15, forming the space (first space) 90 having a small volume. The acceleration sensor element 40 is disposed on a bottom surface 16 forming the space 90.

The embodiment produces the following effects in addition to the aforementioned effects.

(7) The interaction between the sensor elements due to vibrations of them can be lowered since the bottom surface 16 and the bottom surface 111 are not on the same plane. The bottom surface 16 forms the space (first space) 90 in which the acceleration sensor element 40 is disposed while the bottom surface 111 forms the space (second space) 80 in which the vibration type angular velocity sensor elements 50 and 60 are disposed.

(8) Most of the space 90 is structured by the recessed section 15 of the container 10, which is one structural body. This structure reduces the number of leak paths from the space 90 to the space (second space) 80, further lessening the chance of a leak.

Third Embodiment

Figure 6:
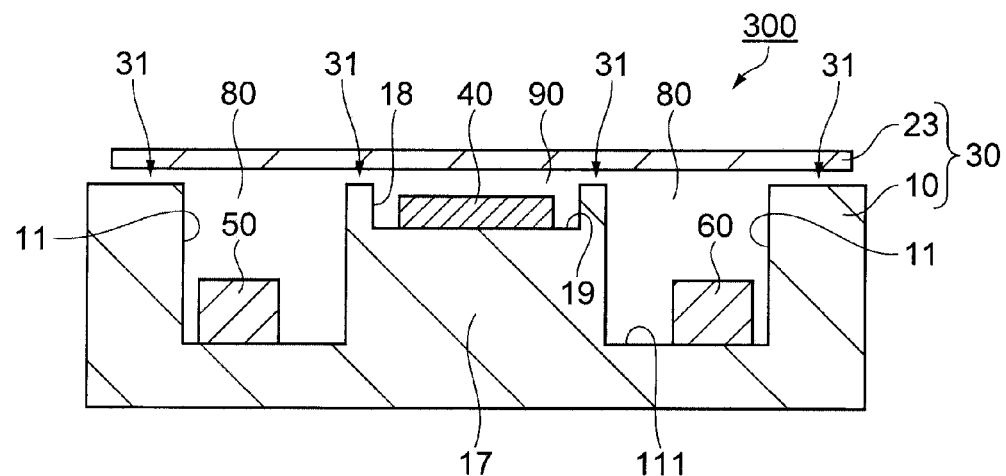
FIG. 6 is a schematic sectional view of a composite sensor of a third embodiment of the invention.

FIG. 6 shows a schematic cross sectional view of a composite sensor 300 according to a third embodiment of the invention.

The same numeral is given to the same component of the first embodiment. The differences from the first embodiment are mainly described below. The through hole 12 and the sealing member 13 are omitted.

In the third embodiment, a protruded section 17 is provided in the recessed section 11 of the container 10, and a recessed section 18 is provided to the protruded section 17. A lid 23, which is single plate, is welded at welding sections 31 to the container 10 thus structured to achieve the package 30 in which the spaces 80 and 90 are formed.

The acceleration sensor element 40 is disposed on a bottom surface 19 forming the space 90.

The embodiment produces the following effects in addition to the aforementioned effects.

(9) The degree of positional freedom of the space (second space) 80 and the space (first space) 90 is increased. Accordingly, the lid 23 can be welded to the container 10 at the welding sections 31 on the same plane, enabling seam welding to be easily conducted.

Fourth Embodiment

Figure 7:
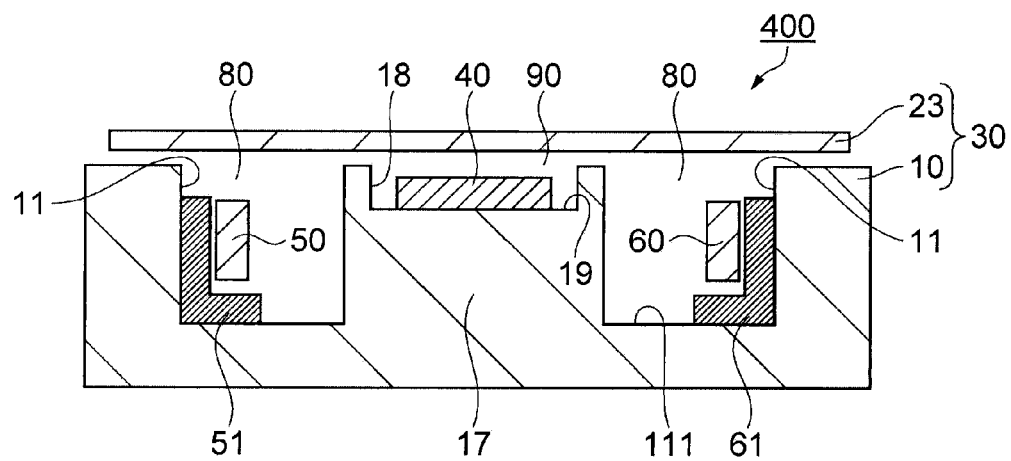
FIG. 7 is a schematic sectional view of a composite sensor of a fourth embodiment of the invention.

FIG. 7 shows a schematic cross sectional view of a composite sensor 400 according to a fourth embodiment of the invention. The same numeral is given to the same component of the third embodiment. The differences from the third embodiment are mainly described below. The through hole 12 and the sealing member 13 are omitted.

In the fourth embodiment, the vibration type angular velocity sensor elements 50 and 60 are attached to the side surfaces of the recessed section 11 by using substrates 51 and 61 for wiring so as to have different detection axes from each other.

Modification 2

Figure 8:
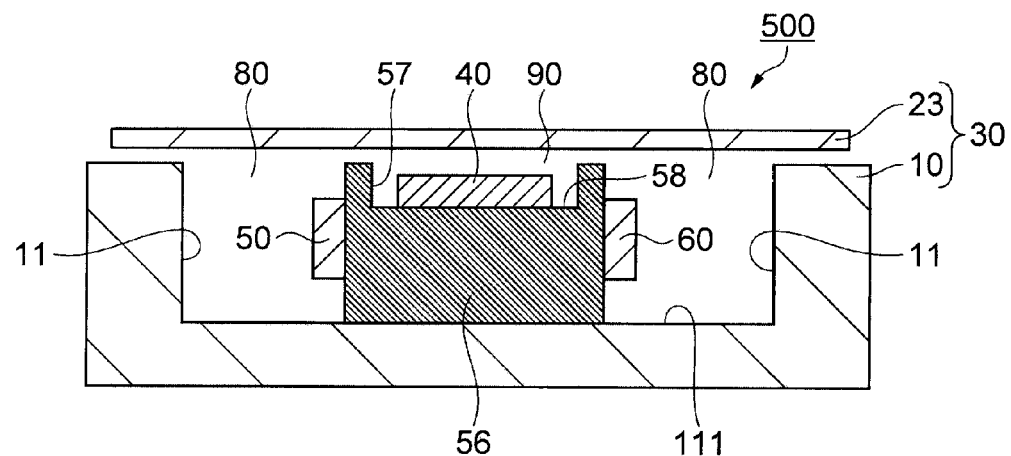
FIG. 8 is a schematic sectional view of a composite sensor of a modification 2.

FIG. 8 shows a schematic cross sectional view of a composite sensor 500 according to a modification 2. The same numeral is given to the same component of the third embodiment. The through hole 12 and the sealing member 13 are omitted.

The differences from the third embodiment are mainly described below.

In the modification 2, a substrate 56 for wiring is disposed on the bottom surface 111 instead of the protruded section 17 of the third embodiment.

The substrate 56 has a recessed section 57 instead of the recessed section 18 of the third embodiment. The acceleration sensor element 40 is disposed on a bottom surface 58, which forms the space 90 with the recessed section 57 and the lid 23 so as to surround the space 90.

The vibration type angular velocity sensor elements 50 and 60 are attached to the side surfaces of the substrate 56.

The fourth embodiment and the modification 2 produce the following effect.

(10) The vibration type angular velocity sensor elements 50 and 60 can be disposed so as to have different direction axes from each other.

Fifth Embodiment

Figure 9:
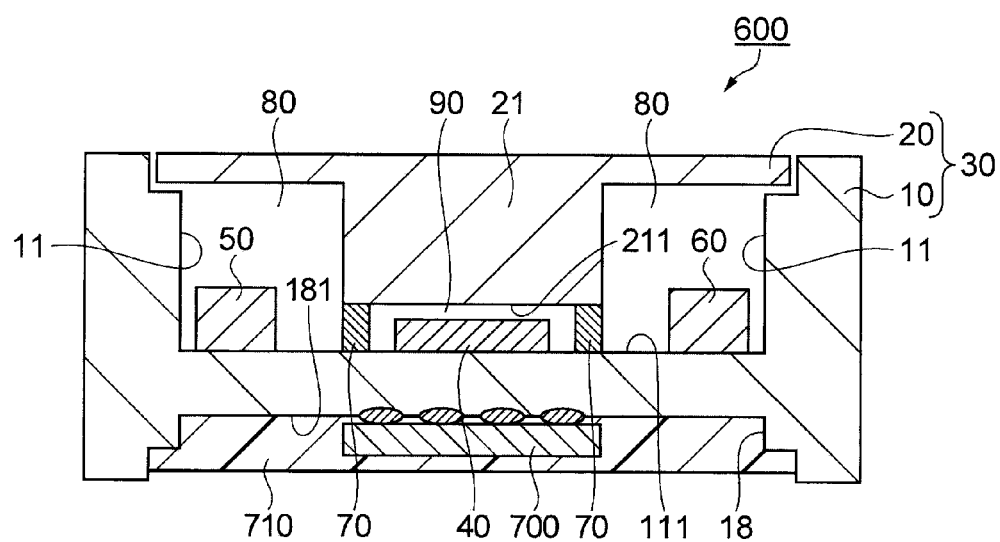
FIG. 9 is a schematic sectional view of a composite sensor of a fifth embodiment of the invention.

FIG. 9 shows a schematic cross sectional view of a composite sensor 600 according to a fifth embodiment of the invention. The same numeral is given to the same component of the first embodiment. The through hole 12 and the sealing member 13 are omitted. The differences from the first embodiment are mainly described below.

In the fifth embodiment, the container 10 shows what is called as an H type structure. A recessed section 18 is formed in the container 10 at a side opposite to the recessed section 11. On a bottom surface 181 of the recessed section 18, mounted is a sensor signal processing integrated circuit 700 by flip chip mounting, for example. The sensor signal processing integrated circuit 700 is buried with a thermoset resin 710.

The fifth embodiment produces the following effect.

(11) The composite sensor 600 can be provided with a small size including the sensor signal processing integrated circuit 700.

In addition to the embodiments described above, various changes can be conducted.

For example, gas inside the space 90 may be rare gas such as He, and Ne, or nitrogen gas. Using a medium having a viscosity coefficient larger than that of air can attain a larger dumping effect.

Further, a pressure difference can be set as follows: the container 10 and the lids 20 and 23 are bonded while being depressurized; the through hole 12 is provided to a wall forming the space 90; and then gas is introduced from the through hole 12 to set the pressure difference.

The shapes of the package 30, the space 90, and the like are not limited to a cubic shape. A columnar shape may be employed, for example. The sensor signal processing integrated circuit 700 may be housed in either the large or the small space, or in both spaces.

The present invention is not limited to this, the composite sensor 100 also can be used for electronic device such as a digital camera, a car navigation system, a mobile phone, a mobile personal computer, a game controller. It is possible to control the fluctuation of the characteristics in a long period of time.

The entire disclosure of Japanese Patent Application No. 2009-033604, filed Feb. 17, 2009 is expressly incorporated by reference herein.

What is claimed is:

1. A composite sensor, comprising:
a package including a first space having a first pressure and a first thickness, and the package including a second space having a second pressure lower than the first pressure and a second thickness;
an acceleration sensor element disposed in the first space; and
a vibration type angular velocity sensor element disposed in the second space, wherein the first space has a volume smaller than a volume of the second space, and the first thickness is smaller than the second thickness.

2. The composite sensor according to claim 1, the package including a container, a lid and a partitioned member, the first space and the second space is partitioned by the partitioned member.

3. The composite sensor according to claim 1, wherein at least one of a wall forming the first space and a wall forming the second space has a through hole, the through hole is sealed by a sealing member.

4. The composite sensor according to claim 1, wherein a height of a bottom surface forming the first space and a height of a bottom surface forming the second space are different from each other.

5. The composite sensor according to claim 2, wherein at least one of the container and the lid has a layered structure.

6. An electronic device comprising the composite sensor according to claim 1.

7. An electronic device comprising the composite sensor according to claim 2.

8. An electronic device comprising the composite sensor according to claim 3.

9. An electronic device comprising the composite sensor according to claim 4.

10. An electronic device comprising the composite sensor according to claim 5.

* * * * *